United States Patent [19]

Akamine et al.

[11] Patent Number: 5,021,364

[45] Date of Patent: Jun. 4, 1991

[54] MICROCANTILEVER WITH INTEGRAL SELF-ALIGNED SHARP TETRAHEDRAL TIP

[75] Inventors: Shinya Akamine; Calvin F. Quate, both of Stanford, Calif.

[73] Assignee: The Board of Trustees of the Leland Stanford Junior University, Stanford, Calif.

[21] Appl. No.: 429,415

[22] Filed: Oct. 31, 1989

[51] Int. Cl.$^5$ ............................................. H01L 21/465
[52] U.S. Cl. .................................. 437/228; 250/306; 156/647
[58] Field of Search ........................ 437/228; 250/306

[56] References Cited

U.S. PATENT DOCUMENTS

| | | | |
|---|---|---|---|
| 3,977,925 | 8/1976 | Schwabe | 437/228 |
| 4,312,117 | 1/1982 | Robillard | 437/228 |
| 4,668,865 | 5/1987 | Gimzewski | 250/306 |
| 4,806,755 | 2/1989 | Duerig | 250/306 |
| 4,943,719 | 7/1990 | Akamine | 73/105 |

OTHER PUBLICATIONS

Angell, Terry, and Barth, "Silicon Micromechanical Devices", Scientific American, Apr. 1983, vol. 248, No. 4, pp. 44–55.

Primary Examiner—Brian E. Hearn
Assistant Examiner—Deborah Wortman
Attorney, Agent, or Firm—Flehr, Hohbach, Test, Albritton & Herbert

[57] ABSTRACT

Apparatus and method for forming a microfabricated cantilever with a single crystal, integral silicon tip on a nitride cantilever. A nitride-silicon-nitride sandwich structure is patterned and etched to form a cantilever structure, exposing sidewall portions of the silicon layer. The exposed sidewall portions of the silicon layer are oxidized to form oxide sidewalls. The top nitride layer is removed and the silicon layer is anisotropically etched and removed except fo a tetrahedral silicon tip formed on the rear nitride layer. The tetrahedral silicon tip has one exterior surface bounded by a (111) plane with two additional exterior surfaces bounded by the oxide sidewall. The oxide sidewall is removed to provide a tetrahedral silicon tip at the free end of the nitride cantilever. Alternative cantilever materials such as polysilicon and deposited oxide can be substituted for nitride. Doping the surface region of the cantilever form a P-N junction which provides a stop for electrochemical anisotropic etching of the silicon layer when an electrical potential is applied across the P-N position.

16 Claims, 9 Drawing Sheets

MICROCANTILEVER WITH INTEGRAL SELF-ALIGNED SHARP TETRAHEDRAL TIP

This invention was made with United States Government support under ONR/DARPA Contract No. N00014-84-K-0624. The Government has certain rights in this invention.

BACKGROUND OF THE INVENTION

1. Field of the Invention

This invention relates to apparatus and methods for forming thin-film microcantilevers for use in atomic force microscopes and other microscope systems.

2. Prior Art

An atomic force microscope (AFM) scans over the surface of a sample in two different modes of operation. In one mode, the contacting mode, a sharp tip is mounted on the end of a cantilever and the tip rides on the surface of a sample with an extremely light tracking force, on the order of $10^{-5}$ to $10^{-10}$ N. In the contacting mode of operation, profiles of the surface topology are obtained with extremely high resolution. Images showing the position of individual atoms are routinely obtained. In the other mode, the tip is held a short distance, on the order of 5 to 500 Angstroms, from the surface of a sample and is deflected by various forces between the sample and the tip, such forces include electrostatic, magnetic, and van der Waals forces.

Several methods of detecting the deflection of the cantilever are available which have subangstrom sensitivity, including vacuum tunneling, optical interferometry, optical beam deflection, and capacitive techniques. However, fabrication of a readily reproducible cantilever stylus assembly has been a limiting factor on use of AFM and other forms of microscopy such as scanning tunneling microscopes.

The technical requirements for a cantilever stylus assembly, which includes a cantilever arm and a protruding tip, include a number of different factors. A low force constant for the cantilever is desirable so that reasonable values of deflection are obtained with relatively small deflection forces. Typical values are 0.01–1000N/m. A mechanical resonant frequency for the cantilever which is greater than 10 kHz ia desirable to increase image tracking speed and to reduce sensitivity to ambient vibrations. Low force constants and high resonant frequencies are obtained by minimizing the mass of the cantilever and the tip.

When optical beam deflection is used to detect deflection of the cantilever, deflection sensitivity is inversely proportional to the length of the cantilever. Therefore a cantilever length of less than 1 mm is desirable.

For certain types of deflection sensing, a high mechanical Q is desirable and is achieved by using amorphous or single crystal thin films for fabrication of the cantilever.

In many applications, it is desirable that the cantilever flex in only one direction and have high lateral stiffness. This can be obtained by using a geometry such as V-shape which has two arms obliquely extending and meeting at a point at which the tip is mounted.

It is often required that a conductive electrode or reflective spot be located on the side of the cantilever opposite the tip. This is obtained by fabricating the cantilever from metal or depositing a conductive material on certain portions of the cantilever to serve as a conductor or reflector.

Finally, a sharp tip, that is, a protruding tip with a tip radius less than 500 Angstroms and which may terminate in a single atom, is desired to provide good lateral resolution. This requirement has traditionally been one of the most difficult to obtain in a reproducible manner. Typically, in the prior art, tips were made by hand using fabrication and bonding techniques which were time consuming and which produced non-uniformly performing tips.

In the prior art, cantilever arms were constructed by hand from fine tungsten wires. One way of obtaining a tip portion on such an arm was to etch the wire to a point and then bend the point to perpendicularly extend from the wire. Another way to obtain a tip was to glue a tiny diamond fragment in place at the end of a cantilever. Prior art cantilevers fabricated using photolithographic techniques did not have integrally-formed sharp protruding tips. For these cantilevers a rather dull tip was effectively obtained by using a corner of the microfabricated cantilever itself as a tip. Alternatively, a diamond fragment was glued by hand to the end of a microfabricated cantilever. The cantilever assembly of an AFM is relatively fragile and is virtually impossible to clean when it is contaminated by material from the surface being scanned so that frequent replacement is required.

Currently, technologists are attempting to microfabricate STMs and AFMs using microfabrication techniques which are compatible with standard fabrication processes used in the silicon semiconductor integrated circuit industry. Their goal is to mass-produce very precise, very reliable sensors which have minimal thermal drift, signal loss, and low noise characteristics by taking advantage of the inherent low mass, high resonant frequencies, and low thermal drift characteristics of microfabricated devices. In addition, these microfabricated sensors can be integrally combined with electronic circuitry fabricated with the same processes.

SUMMARY OF THE INVENTION

It is therefore an object of the invention to provide an improved cantilever assembly for an AFM which is fabricated using semiconductor integrated circuit fabrication techniques.

It is another object of the invention to provide a self-aligned tip for an integrally-formed microfabricated cantilever arm assembly.

In accordance with these and other objects of the invention, a nitride cantilever formed from a deposited layer of silicon nitride is provided which has integrally fixed to its free end a single-crystal, silicon tip. The silicon tip has a tetrahedral structure with a base in the (100) plane and fixed to the nitride layer. An exterior surface of the tetrahedral silicon tip is bounded by a (111) plane and the two additional exterior surfaces are bounded by surfaces which have been defined by a thermally grown oxide sidewall. The process begins with providing a (100) silicon wafer having a front side and a rear side. The rear side is anisotropically etched to form a silicon membrane in the silicon wafer. Nitride layers are formed on the front side and the rear side of the silicon membrane to form a nitride-silicon-nitride sandwich structure which is patterned and etched to remove portions of the silicon membrane and the nitride layers to form a cantilever structure, exposing sidewall portions of the silicon membrane. The exposed sidewall portions are subsequently oxidized to form the previously mentioned oxide sidewalls. In a subsequent step the top nitride layer is removed to expose the front side of the silicon membrane. The silicon membrane is then anisotropically etched to remove the silicon membrane material overlying the rear-side nitride layer except for a portion providing a tetrahedral silicon tip formed on the surface of the rear-side nitride layer. The tetrahedral silicon tip consequently has one exterior surface bounded by a (111) plane resulting from the anisotropic etching and two additional exterior surfaces bounded by the oxide sidewall.

Alternatively, other cantilever materials such as deposited oxide or polysilicon are substituted for the bottom layer of nitride and processed appropriately to form cantilever arm with integral, self-aligned silicon tips at the free ends thereof.

As another alternative embodiment of the invention, the bottom surface region of the silicon substrate is doped, for example, by ion implantation to provide a P-N junction in the silicon substrate. During electrochemical anisotropic etching of the (100) silicon wafer, an elective potential is applied across the P-N junction and the etching stops when the doped surface region is reached, leaving a doped silicon cantilever with an integral, self-aligned silicon tip at its free end.

An obliquely extending surface of the silicon wafer is formed in a (111) plane when the rear side of the silicon wafer is anisotropically etched to form the silicon membrane. The rear-side layer of nitride is extended to cover the obliquely extending lateral edge of the silicon wafer and is connected to the layer of nitride forming the cantilever portion.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
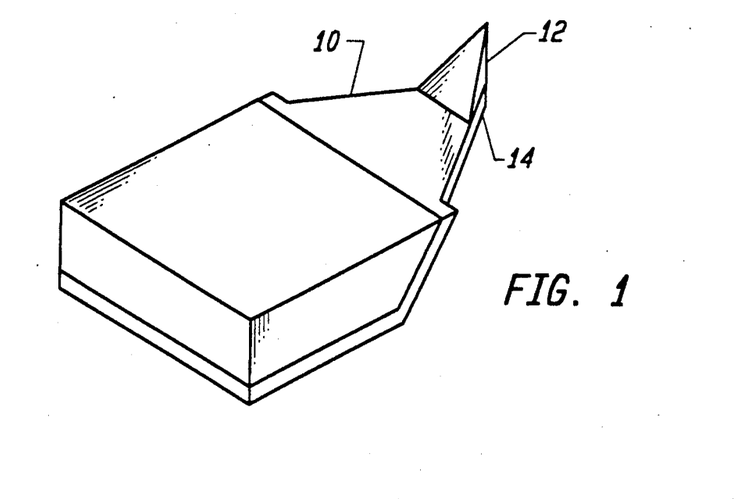
FIG. 1 is a perspective view of a silicon nitride cantilever with a self-aligned, integral tetrahedral silicon tip.

FIG. 1 shows a microfabricated silicon nitride ($Si_3N_4$) cantilever 10 with an integral, sharp, tetrahedral, silicon tip 12 which is fabricated using conventional semiconductor integrated circuit fabrication techniques. The process for producing this cantilever provides a robust silicon nitride cantilever having a sharp tetrahedral tip 12 having, for example, a radius of curvature less than 500 Angstroms. The process for producing this cantilever assembly provides cantilevers which are highly reproducible. The sharp silicon tip 12 is self-aligned to the end of cantilever arm 10. The process for producing the cantilever requires only two integrated-circuit masks and one non-critical alignment. It will be seen that the cantilever 10 is required to have a sharp end 14 pointing in the <110> crystal direction and the sides of the cantilever 10 must not be parallel to the (110) planes of the silicon crystal.

The following figures illustrate various steps in the process used for forming the silicon nitride cantilever 10 with an integrally attached tetrahedral tip 12.

Figure 2A:
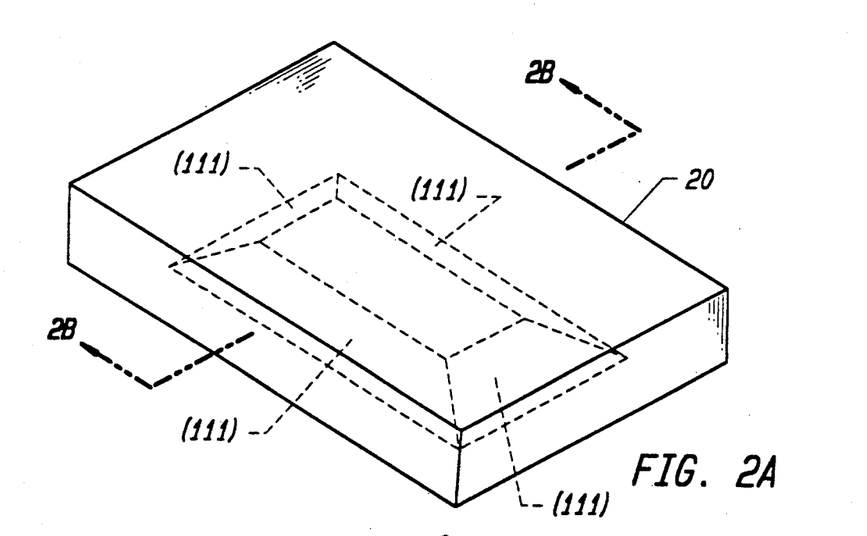
FIGS. 2A and 2B are, respectively, a perspective view and a sectional perspective view of an etched silicon substrate which is anisotropically etched to form a silicon membrane.
Figure 2B:
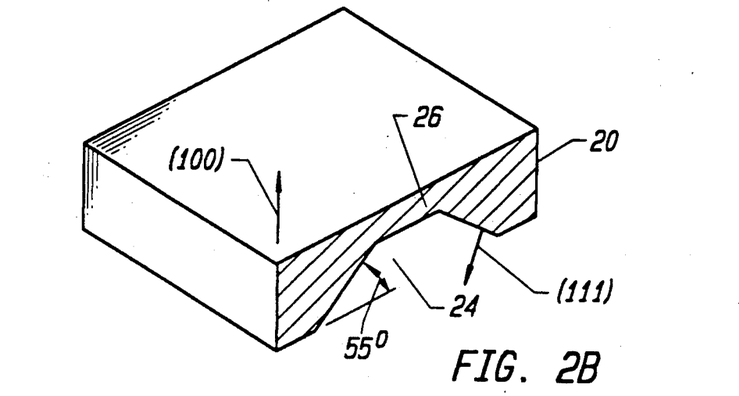

FIGS. 2A and 2B illustrate that the process for forming the nitride cantilever with the integrally attached tetrahedral silicon tip 12 begins with a silicon wafer 20 having a (100) orientation. A rectangular photoresist pattern is formed on the back side of the silicon wafer. The rectangular pattern has its long sides parallel to the <110> direction such that when the exposed silicon is anisotropically etched, a rectangular pit 24 is formed which has oblique sides bounded by (111) planes, as shown. The anisotropic etch is stopped when a silicon membrane 26 of a desired thickness is obtained at the base of the pit 24. The thickness of the silicon membrane 26 determines to some extent the height of the tetrahedral silicon tip 12 to be formed. The thickness of the silicon membrane 26 can be adjusted by subsequent etching steps to provide a desired height of the tip 12. Alternatively, the thickness of membrane 26 can also be controlled by appropriate doping and electrochemical etch stop as described by Jackson, et al. in *IEEE Election Device Letters*, Vol. EOL-2, No. 2 Feb. 1981, p. 44 in a paper entitled "An Electrochemical P-N Junction Etch-Stop for the Formation of Silicon Microstructures" and by Kloeck, et al. in *IEEE Transactions on Electron Devices*, Vol. 36, No. 4, April 1989, p. 663 in a paper entitled "Study of Electrochemical Etch-Stop for High-Precision Thickness Control of Silicon Membranes."

Figures 3A, 3B:
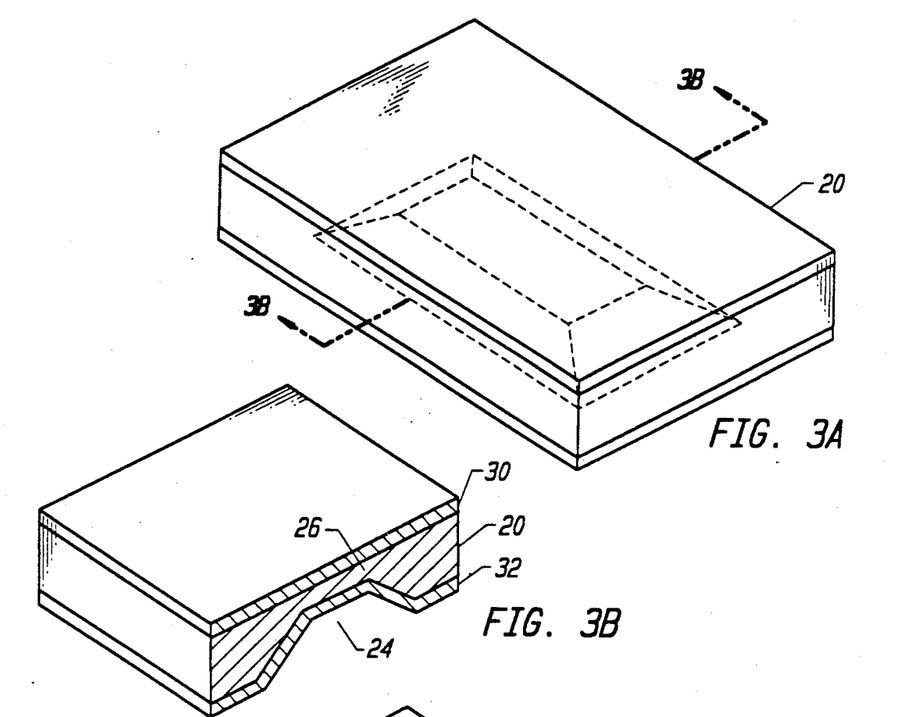
FIGS. 3A and 3B are, respectively, a perspective view and a sectional perspective view of the silicon substrate having layers of nitride deposited on the front and back sides.

FIGS. 3A and 3B show a portion of the silicon wafer 20 which has a protective nitride layer 30 deposited on its front side and a nitride layer 32 deposited on its back side. Initially, each of these layers is a 5,000 Angstrom layer of low-pressure chemical vapor deposition LPCVD silicon nitride $Si_3N_4$. The silicon nitride layer 30 on the front side of the wafer is thinned to approximately 2,500 Angstroms by reactive plasma etching. Alternatively, the layer 30 is formed of other suitable materials to protect the top surface of the silicon wafer 20 during subsequent process steps.

Figures 4A, 4B:
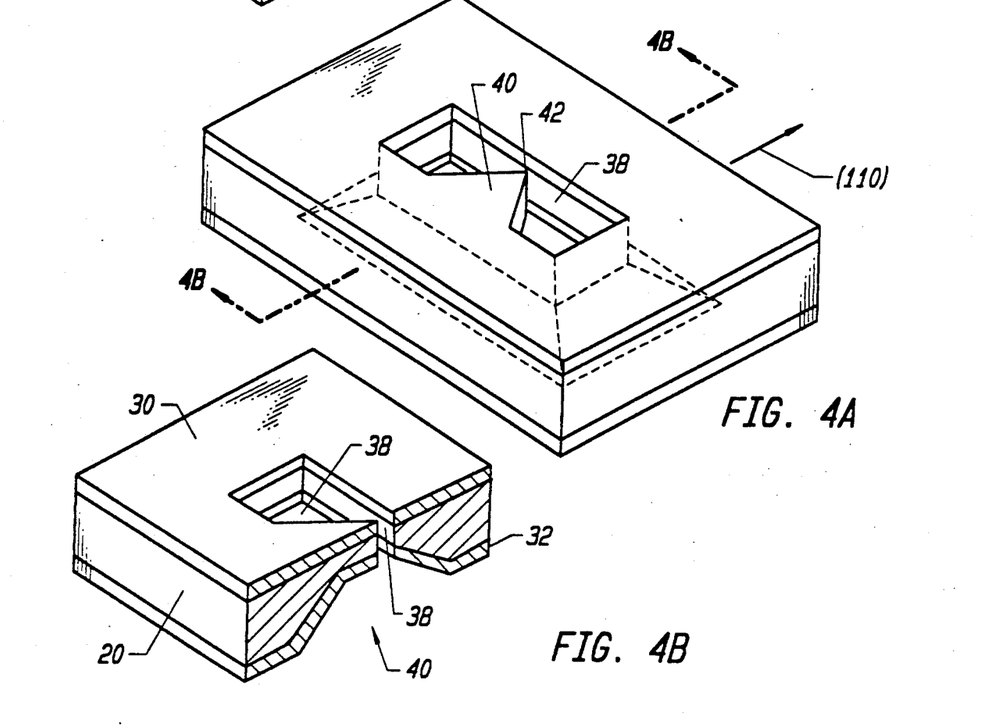
FIGS. 4A and 4B are, respectively, a perspective view and a sectional perspective view of the silicon substrate which has been patterned and vertically etched to remove portions of the silicon membrane and to form a nitride-silicon-nitride cantilever structure.

FIGS. 4A and 4B show the results of a photoresist pattern having been formed on the front side of the silicon wafer to be used as a mask to permit removal of portions of the nitride layers 30, 32 and the silicon membrane 26 by a reactive plasma, leaving an aperture 38, as shown. The reactive plasma etch process step is terminated when the silicon membrane and the nitride layer 32 are completely etched through to leave a free standing nitride-silicon-nitride cantilever structure 40. The cantilever structure 40 includes a sharp corner portion 42 which points in the <110> direction. This sharp corner 42 defines the location of the silicon tip 12 to be subsequently formed.

Figure 5:
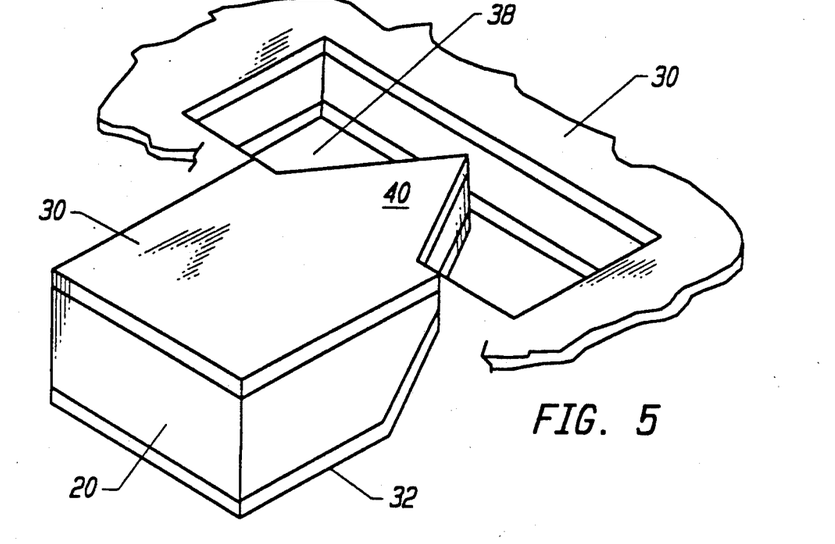
FIG. 5 is an enlarged perspective view of the nitride-silicon-nitride cantilever structure of FIGS. 4A and 4B.

FIG. 5 illustrates in somewhat more detail the nitride-silicon-nitride cantilever structure 40 which consists of a silicon layer 20 sandwiched between the two nitride layers, or films, 30, 32. The structure 40 is shown in relation to the outlines of the oblique walls of the rectangular pit 24 and in relation to the aperture 38.

Figure 6A:
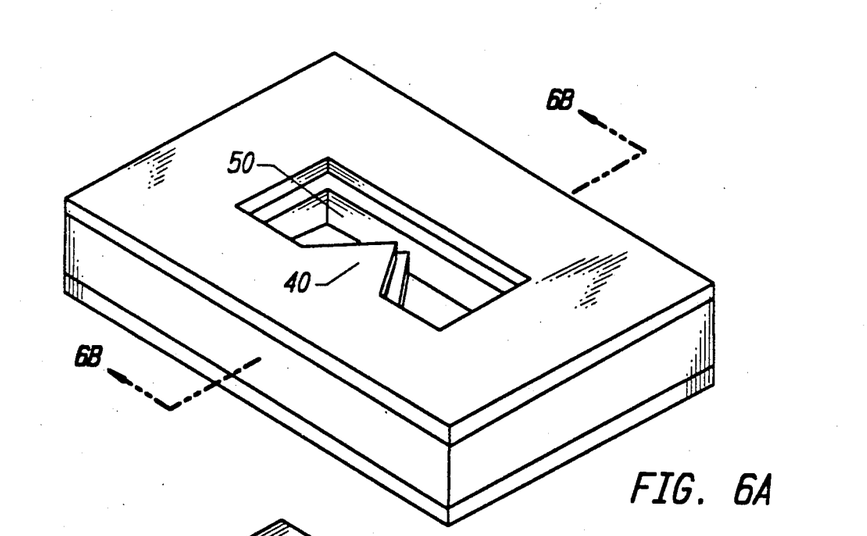
FIGS. 6A and 6B are, respectively, a perspective view and a sectional perspective view of the silicon substrate with the exposed edges of the silicon layer of the nitride-silicon-nitride cantilever structure oxidized to form oxide sidewalls.
Figure 6B:
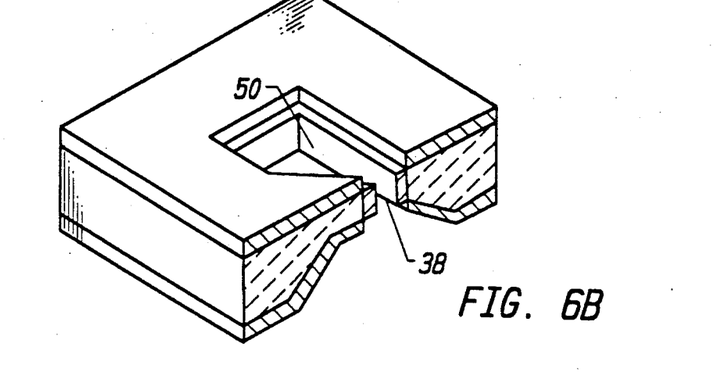

FIGS. 6A and 6B illustrate that after the cantilever 40 has been formed, the silicon wafer is thermally oxidized at a low temperature so that a thin film 50 of silicon dioxide grows on the exposed silicon sidewalls of the cantilever 40 but does not grow on either the top or bottom nitride surfaces of the cantilever because the silicon nitride prevents such growth. The oxidation is done at a relatively low temperature, for example, 950° C., because low-temperature oxidation has the effect of making sharp, angled, silicon features even sharper when the oxide is removed from the silicon In this process, the ultimate sharpness of the silicon point of the tip 12 relies in part on the sharpening effect of using a low-temperature oxidation process step on the sharp, angled, features of the point, particularly at the junction of the vertical oxide sidewalls next to the very point of the tip.

Figure 7:
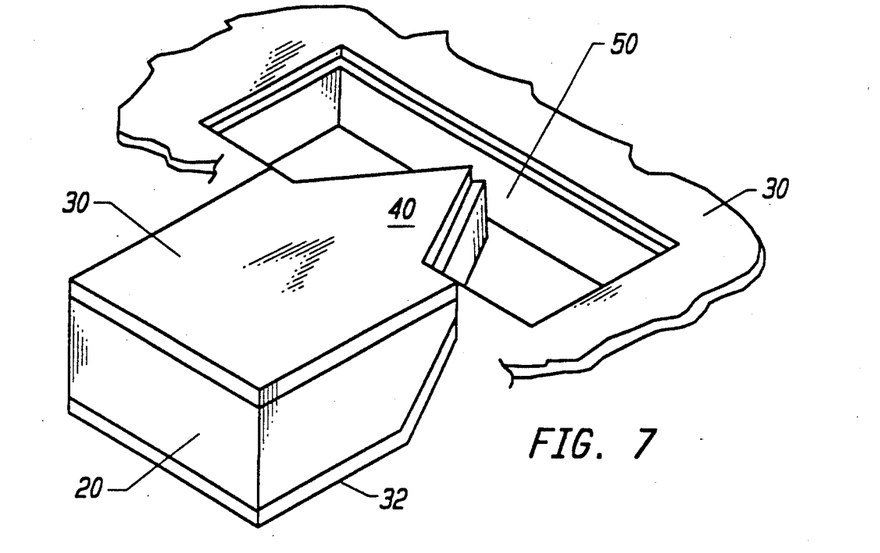
FIG. 7 is an enlarged perspective view of the nitride-silicon-nitride cantilever structure with the oxide sidewalls of FIGS. 6A and 6B.

FIG. 7 shows in more detail the oxidation of the exposed portion of the silicon layer, with the oxide sidewall 50 being grown only on the exposed silicon surfaces of the sidewalls. At this point in the process, the structure formed includes a single crystal silicon cantilever 40 whose top and bottom surfaces are covered by nitride and whose vertical sidewalls are covered by silicon dioxide.

Figure 8A:
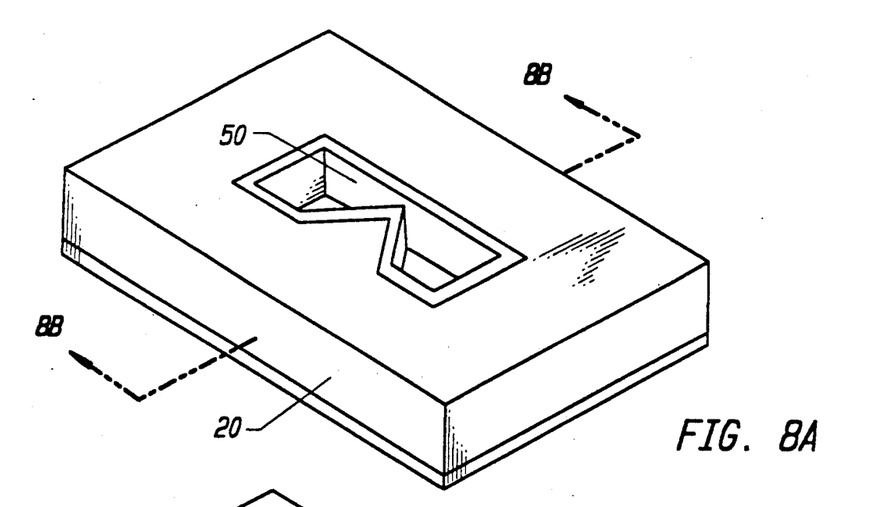
FIGS. 8A and 8B are, respectively, a perspective view and a sectional view of the silicon substrate with the front nitride layer removed.
Figure 8B:
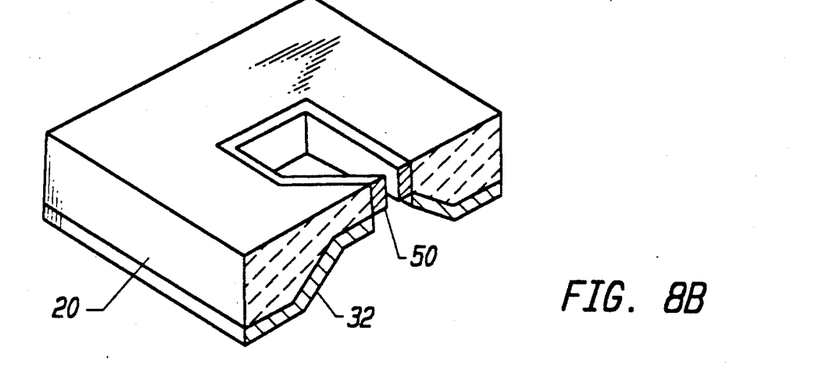

FIGS. 8A and 8B show the nitride on the top of the cantilever 40 has been selectively removed on a reactive plasma etched step.

Figure 9A:
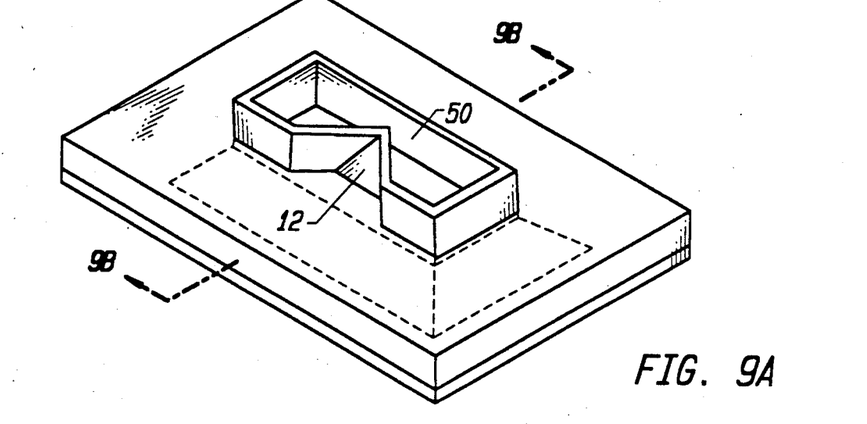
FIGS. 9A and 9B are, respectively, a perspective view and a sectional perspective view of the silicon substrate when the silicon layer is anisotropically etched to leave a nitride cantilever with a tetrahedral silicon tip at its end and to leave the oxide sidewalls.
Figure 9B:
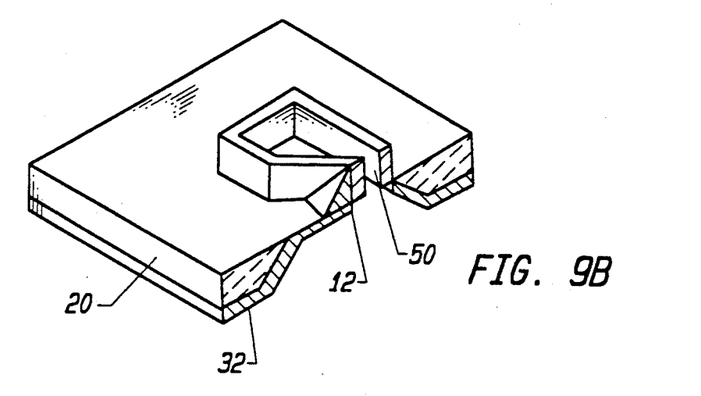

FIGS. 9A and 9B show the structure remaining when an anisotropic etchant such as KOH is used to etch the silicon from the top of the cantilever 40. The silicon is not etched where the silicon dioxide on the sidewalls and the remaining nitride layers mask the bottom surface of the silicon. The anisotropic etchant preferentially attacks all crystal planes that are not (111) planes. Consequently, the final result is a tetrahedral-shaped silicon tip 12 which has its two vertical surfaces resting against portions of the silicon dioxide sidewalls 50 at the end 42 of the cantilever 40. The rest of the silicon from the cantilever 40 is removed by the anisotropic etchant step because no stable (111) plane of silicon material can be formed anywhere else within the silicon layer of the cantilever 40 other than at its tip.

Figure 10:
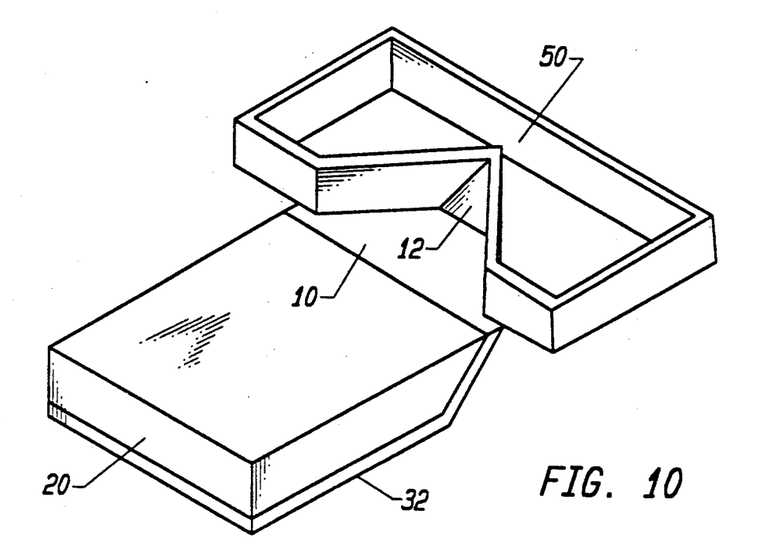
FIG. 10 is an enlarged perspective view of the nitride cantilever and the oxide sidewalls of FIGS. 9A and 9B.

FIG. 10 illustrates in more detail the formation of the tetrahedral tip 12 bounded by a (111) plane and the oxide sidewalls 50 at the corner of the cantilever.

Figures 11, 12:
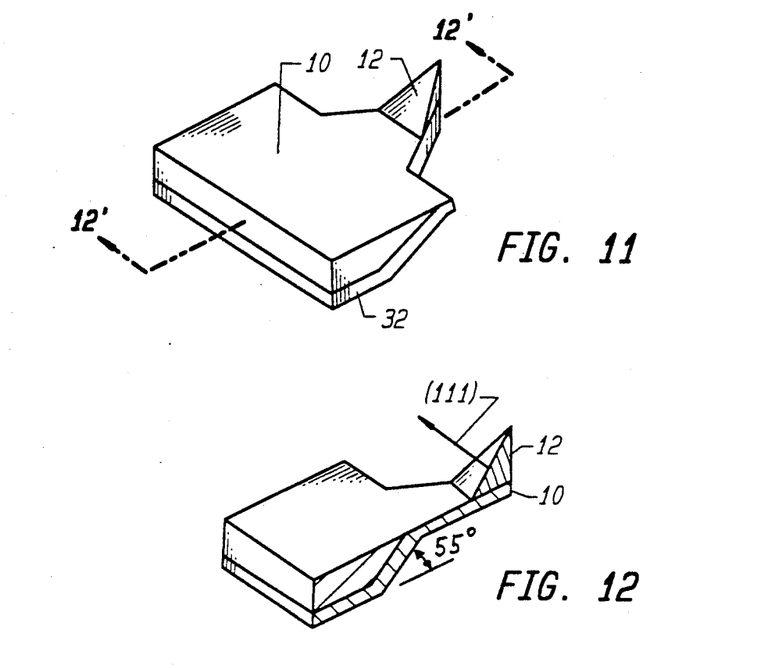
FIG. 11 is a perspective view of the nitride cantilever with a tetrahedral silicon tip when the oxide sidewalls are removed.
FIG. 12 is a sectional perspective view of the cantilever and tip of FIG. 11.
Figure 13A:
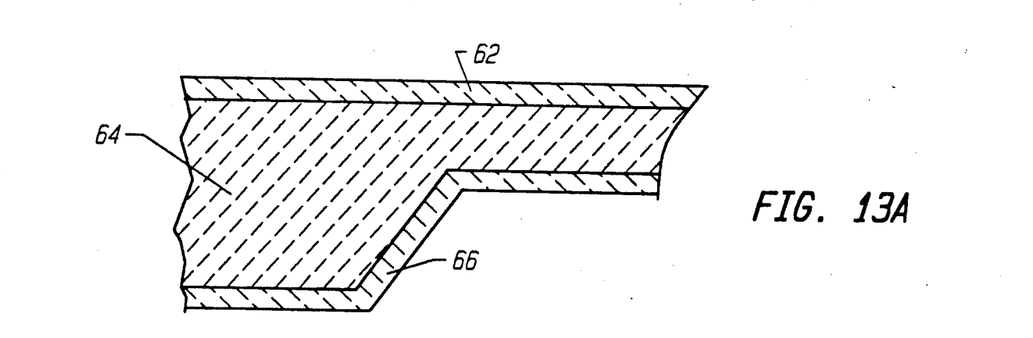
FIG. 13A is a sectional view of the silicon substrate in which a nitride-silicon-nitride cantilever is formed as such that the silicon sidewalls slope is at an angle with respect to vertical.

FIGS. 11 and 12 illustrate a final nitride cantilever 10 and tip 12 formed when the silicon dioxide sidewalls 50 are selectively removed, for example, in HF acid-based etchant leaving the sharp silicon tip 12 on a free-standing silicon nitride cantilever 10, as also shown in FIG. 1 of the drawings. The process according to the invention provides the cantilever 10 with an integral, self-aligned sharp, tetrahedral, silicon tip 12 which is fabricated using conventional semiconductor integrated circuit fabrication techniques. The process for producing this cantilever provides a highly reproducible robust silicon nitride cantilever having a sharp tetrahedral tip 12. The sharp silicon tip 12 is self-aligned to the cantilever arm 10 and requires only two integrated-circuit masks and one non-critical alignment FIG. 13A shows a nitride-silicon-nitride cantilever structure 60 having a top nitride layer 62, a silicon substrate 64, and a lower nitride layer 66 as shown. Instead of the end of this structure being vertically etched, the end of this structure is etched such that the sidewall of the silicon substrate 64 is sloped as shown. This sidewall slope is varied to alter the final shape of an integral silicon tip formed at the end of the lower nitride layer 66.

Figure 13B:
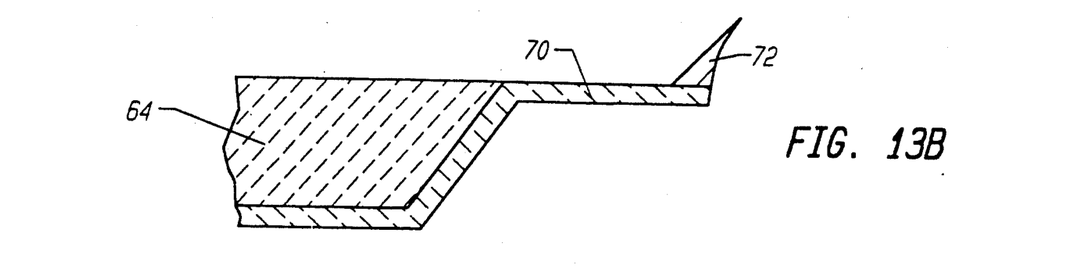
FIG. 13B is an enlarged, perspective view of a nitride cantilever with a tetrahedral silicon tip having a sloped leading edge.

FIG. 13B shows a nitride cantilever 70 extending from a portion of the silicon substrate 64 and having a tetrahedral silicon tip 72 formed at its end. The silicon tip 72 is produced as a result of the sidewall slope of the silicon substrate 64 as shown in FIG. 12. This results in the leading edge of the silicon tip 72 being curved as shown.

Figure 14A:
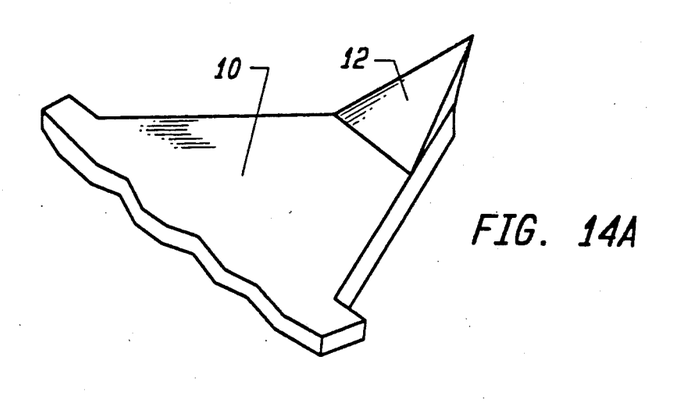
FIG. 14A is a perspective view of a cantilever arm and a integral tetrahedral silicon tip such as shown in FIGS. 1 and 11.

FIG. 14A shows a cantilever arm 10 with an integral tetrahedral tip 12 similar to the structure of FIGS. 1 and 11.

Figure 14B:
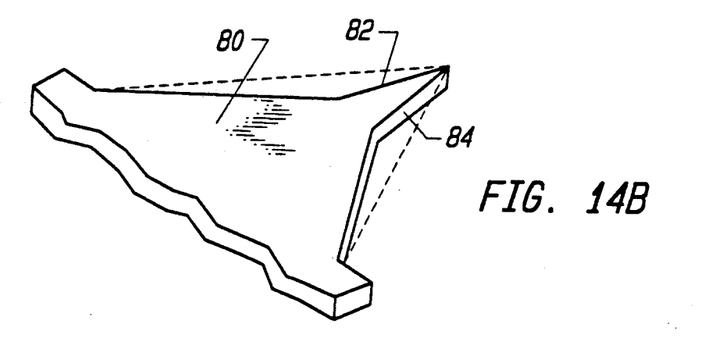
FIG. 14B is a perspective view of a silicon nitride cantilever having a narrower free end.

FIG. 14B shows an alternative embodiment of a cantilever arm 80. The extreme end of the cantilever arm is shaped such that the angle between the sides 82,84 is smaller than that of the cantilever arm 10 such as shown in FIG. 14A. A tip produced with this pattern will have a narrower width.

Figure 14C:
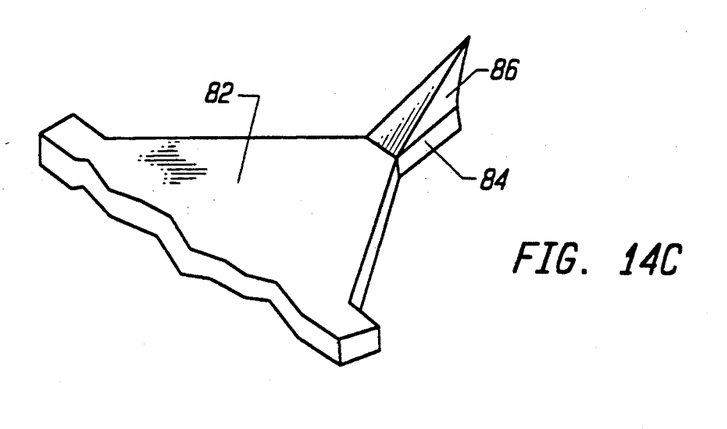
FIG. 14C is a perspective view of the cantilever of FIG. 14B with a tetrahedral silicon tip which is narrower.

FIG. 14C shows a perspective view of a tip 86 fabricated at the end of the cantilever arm 80 as shown in FIG. 14B. Consequently, the width of a silicon tip 86 is altered by changing the angle at which the sides 82,84 of the cantilever 80 meet. An advantage of being able to vary the width of a tip is that the mass of the tip can be varied. For certain applications where a high resonant frequency is desired or where non-contacting microscopy is involved, a tip with low mass is desirable.

It is contemplated by this invention that many of the materials and individual process steps as described hereinabove can be altered without effecting the usefulness of the final structure obtained. For example, the cantilever may be fabricated from silicon dioxide instead of silicon nitride. Also, instead of depositing nitride on the silicon wafer, a high concentration of boron is implanted in the silicon membrane during the initial steps of the process. This results in the boron-doped silicon acting as an etch stop to the anisotropic etchant such that a boron-doped silicon cantilever having an undoped silicon tip is formed. If a silicon dioxide tip is desired, the doped silicon or silicon nitride cantilever is oxidized to turn the silicon tip into a silicon dioxide tip.

FIGS. 15-19 show the results of alternative process steps in forming another embodiment of the self-aligned tip and microcantilever. The tip is formed on a single crystal silicon cantilever using an electrochemical etch stop to control precisely the thickness of the cantilever as described in the Jackson, et al. and in the Kloeck, et al. reference, both identified previously.

Figure 15:
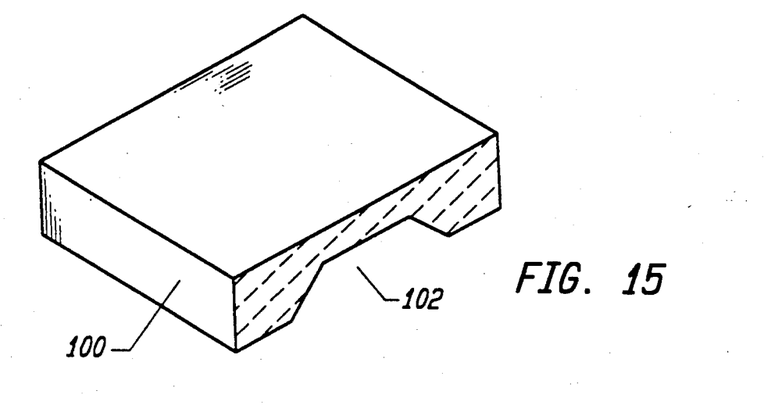
FIG. 15 is a perspective view of a P-type silicon substrate which has a rectangular window etched to its backside and which is used for an alternative embodiment of the invention.
Figure 16:
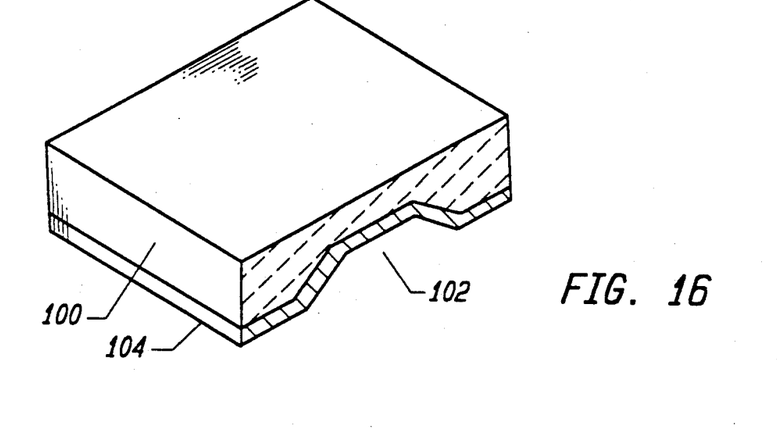
FIG. 16 is a perspective view of the substrate of FIG. 15 with an N-type layer formed in its backside.

FIG. 15 shows a rectangular pit 102 is formed in a P-type silicon substrate 100 as in the original process. Next, donor atoms are ion-implanted from the backside of the wafer such that a layer 104 of lightly-doped N-type silicon is formed as shown in FIG. 16. The thickness of the N-type layer 104 is well controlled by the ion implantation procedure and this thickness determines the final silicon cantilever thickness.

Figure 17:
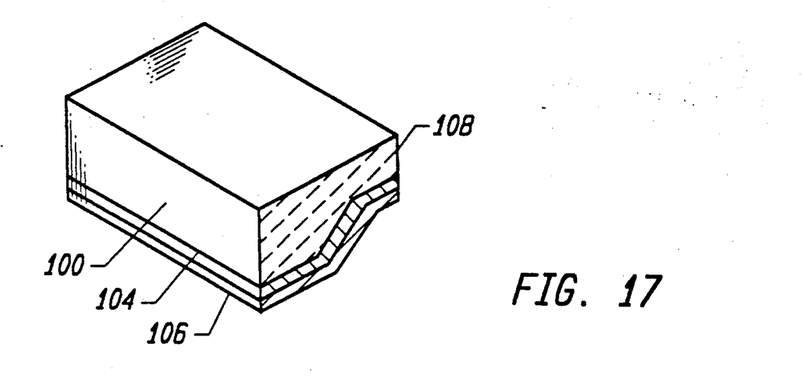
FIG. 17 is a perspective view of a cantilever structure formed in the substrate of FIG. 16 and having a bottom layer of nitride formed thereupon.

The process continues as described previously. FIG. 17 shows the top nitride layer has been removed leaving a bottom nitride layer 106. A silicon cantilever 108 is ready to be anisotropically etched to form a tip.

Figure 18:
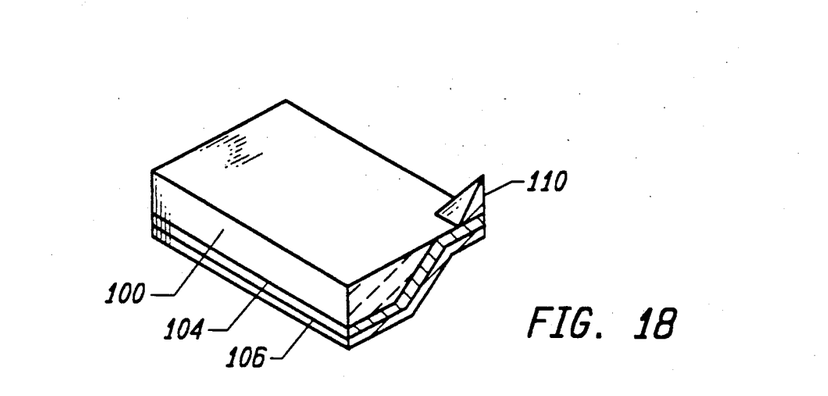
FIG. 18 is a perspective view of a cantilever structure having an integral tip formed after the P-type silicon layer is electrochemically etched.

FIG. 18 shows a tip 110 is formed by electrochemically etching the P-type silicon 100 in a KOH solution while a small (1-5 Volt) potential bias is applied across the P-N junction 104, 106 formed in the cantilever. The electrochemical etch will etch the P-type material normally but will stop etching when the N-type region is reached.

Figure 19:
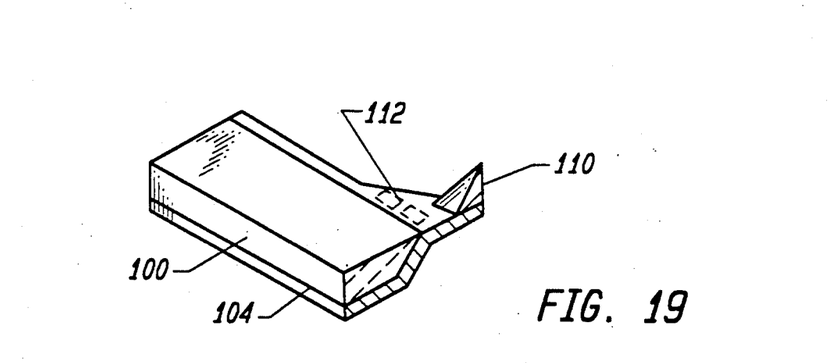
FIG. 19 is a perspective view of a microcantilever having a P-type, single-crystal, integral, self-aligned silicon tip and having a silicon cantilever.

FIG. 19 shows that after the oxide sidewalls and the nitride bottom layer 106 have been selectively removed, the remaining structure is a N-type silicon cantilever 112 of a known thickness with a P-type silicon tip 110. One advantage of using an electrochemical etch-stop technique is that the cantilever thickness can be controlled very accurately thereby maintaining the desired mechanical properties of the cantilever.

Alternatively, the cantilever 10 is formed from a material other than nitride, using process steps to provide structures similar to those shown in FIGS. 1 through 14. Instead of the layer 32 being nitride, a layer of alternative material, for example, deposited oxide or polysilicon is formed on the back side of the silicon wafer. This layer is then formed, using appropriate conventional processing techniques, into a cantilever arm 10 with a single-crystal, self-aligned silicon tip at its end, as shown in FIGS. 1, 11 and 12.

A key step in the fabrication of sharp tetrahedral tips on the cantilevers, as described above, is the step of depositing the cantilever material on the backside of the silicon membrane. Another key step is the fabrication of a free-standing cantilever which has, in effect, a masked bottom surface and masked sidewalls, but a top silicon surface which is exposed to the anisotropic etchants to form a tetrahedral tip.

Microcantilevers formed as described hereinabove and having sharp tips are used in the fields of microscopy and surface profilometry. However, the techniques of etched fabrication of sharp silicon or silicon dioxide tips on silicon or nitride cantilevers is also useful in microfabricated sensors and actuators.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A method of forming a microfabricated cantilever with a single crystal, integral self-aligned silicon tip, comprising the steps of:
   forming a cantilever structure with a silicon membrane having a (100) lower surface on which is formed a layer of cantilever material;
   oxidizing exposed sidewall portions of the silicon membrane to provide an oxide sidewall to define the sides of a silicon tip to be subsequently formed in the silicon membrane;
   anisotropically etching the exposed front surface of the silicon membrane to remove portions of the silicon membrane covering the layer of cantilever material to provide a self-aligned tetrahedral silicon tip having one exterior surface bounded by a (111) plane and having two additional exterior surfaces defined by the oxide sidewall; and
   removing the oxide sidewall to provide a microcantilever formed from the layer of cantilever material and having a tetrahedral silicon tip formed at its free end with the sides of tip defined by the oxide sidewall.

2. The method of claim 1 including the steps of:
   providing a (100) silicon wafer having a front side and a rear side;
   anisotropically etching the rear of the silicon wafer to form a silicon membrane in the silicon wafer;

forming a protective layer on the front side of the silicon membrane and forming a layer of cantilever material on the rear side of the silicon membrane to form a sandwich structure;

patterning and etching the sandwich structure to remove portions of the silicon membrane and the protective layer and the layer of cantilever material to form a cantilever structure and to expose sidewall portions of the silicon membrane; and selectively removing the protective layer on the front side of the cantilever structure to expose the front side of the silicon membrane for subsequent anisotropic etching and formation of the tetrahedral silicon tip.

3. The method of claim 1 including the steps of:

doping the lower surface region of the silicon wafer to provide a P-N junction in said silicon substrate;

providing an electric potential across the P-N junction;

anisotropically etching the silicon substrate by electrochemical etching; and stopping the anisotropic etching when the doped lower surface region of the silicon wafer is reached to provide a doped silicon cantilever arm with an integral, self-aligned silicon tip at its free end, with the sides of said silicon tip defined by the oxide sidewall.

4. The method of claim 2 wherein the protective layer includes silicon nitride.

5. The method of claim 1 wherein the cantilever material includes silicon nitride.

6. The method of claim 1 wherein the cantilever material includes deposited silicon dioxide.

7. The method of claim 1 wherein the cantilever material includes polysilicon.

8. The method of claim 1 including the step of forming the edge of the silicon membrane at an oblique angle with respect to the surface of the layer; and forming the side exterior surfaces of the tetrahedral tip bounded by the oxide sidewall at the oblique angle.

9. A method of forming a microfabricated cantilever with a single crystal, integral silicon tip, comprising the steps of:

providing a (100) silicon wafer having a front side and a rear side;

anisotropically etching the rear side of the silicon wafer to form a silicon membrane in said silicon wafer;

forming a layer of cantilever material on the front side of the silicon membrane and a layer of cantilever material on the rear side of the silicon membrane to form a sandwich structure;

patterning and etching the sandwich structure to remove portions of the silicon membrane and the two layers to form a cantilever structure and to expose sidewall portions of the silicon membrane;

oxidizing the exposed sidewall portions of the silicon membrane to form oxide sidewalls;

selectively removing the layer on the front side of the cantilever structure, to expose the front side of the silicon membrane;

anisotropically etching the exposed front side of the silicon membrane to remove said silicon membrane except for a tetrahedral silicon tip form on the rear side of the nitride layer, said tetrahedral silicon tip having one exterior surface bounded by a (111) plane, said tetrahedral tip having two additional exterior surfaces bounded by the oxide sidewall; and removing the oxide sidewall to provide a cantilever formed from the rearside cantilever-material layer and having a tetrahedral silicon tip at the free end thereof.

10. The method of claim 9 wherein the sandwich is etched at an oblique angle such that the exterior surfaces of the tetrahedral tip bounded by the oxide sidewall are not perpendicular to the second silicon nitride layer forming the nitride cantilever.

11. A microfabricated cantilever with an integral tip, comprising:

a cantilever having a free end, said cantilever formed as a thin film layer; and a single-crystal silicon tetrahedral tip fixed to the free end of the cantilever and having a first surface formed in the (111) crystal plane, a second surface formed in the (100) crystal plane, and two additional surfaces formed in planes extending from the (100) crystal plane to intersect the first surface.

12. The microfabricated cantilever of claim 11 wherein the two additional surfaces are in planes obliquely extending from the (100) crystal plane to intersect the first surface.

13. The microfabricated cantilever of claim 11 including a silicon base formed from a (100) silicon membrane and from which extends the cantilever.

14. The microfabricated cantilever of claim 11 wherein the silicon membrane includes a side surface bounded by the (111) crystal plane and on which is deposited a thin film layer of cantilever material.

15. A microfabricated cantilever with an integral tip, comprising:

a silicon base formed from a (100) silicon wafer, said silicon base having a top surface and a parallel bottom surface formed in (100) crystal planes, said silicon base also having an obliquely extending lateral edge surface formed in the (111) plane;

a layer of nitride covering the obliquely extending lateral edge surface, said layer of nitride having a cantilever portion extending outwardly in the direction of the (100) crystal planes from the top surface of the silicon base, said cantilever portion having a free end; and a tetrahedral silicon tip formed on the free end of the cantilever portion of the layer of nitride, said tetrahedral silicon tip having one exterior surface bounded by a (111) plane, said tetrahedral silicon tip having two additional exterior surfaces bounded by planes extending perpendicularly to the cantilever portion of the layer of nitride.

16. The microfabricated cantilever of claim 10 wherein the tetrahedral silicon tip is further sharpened by differential oxidation of the silicon tip.

* * * * *